United States Patent
Otsuka et al.

(10) Patent No.: US 7,671,375 B2
(45) Date of Patent: *Mar. 2, 2010

(54) NITRIDE-BASED SEMICONDUCTOR DEVICE OF REDUCED VOLTAGE DROP, AND METHOD OF FABRICATION

(75) Inventors: Koji Otsuka, Niiza (JP); Tetsuji Moku, Niiza (JP); Junji Sato, Niiza (JP); Yoshiki Tada, Niiza (JP); Takashi Yoshida, Niiza (JP)

(73) Assignee: Sanken Electric Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/378,963

(22) Filed: Mar. 17, 2006

(65) Prior Publication Data
US 2006/0175628 A1 Aug. 10, 2006

Related U.S. Application Data

(63) Continuation of application No. PCT/JP2004/013820, filed on Sep. 22, 2004.

(30) Foreign Application Priority Data

Sep. 24, 2003 (JP) .............................. 2003-331882
Mar. 26, 2004 (JP) .............................. 2004-092211

(51) Int. Cl.
*H01L 33/00* (2006.01)
(52) U.S. Cl. ...................... 257/96; 257/183.1; 257/200; 257/E33.048; 257/E33.045; 438/47
(58) Field of Classification Search ................ 257/103, 257/183.1, 200, 242, 262, E33.064, 94, 96, 257/E33.045, E33.048; 438/46, 47
See application file for complete search history.

(56) References Cited

U.S. PATENT DOCUMENTS 5,679,965 A * 10/1997 Schetzina .................... 257/103

(Continued)

FOREIGN PATENT DOCUMENTS

JP 2000-004047 A 1/2000

(Continued)

OTHER PUBLICATIONS

A. Krost et al., "Heteroepitaxy of GaN on Si(111)", 2002, IEEE, pp. 41-47.*

(Continued)

*Primary Examiner*—Minh-Loan T Tran
*Assistant Examiner*—W. Wendy Kuo
(74) *Attorney, Agent, or Firm*—Woodcock Washburn LLP

(57) ABSTRACT

A light-emitting diode is built on a silicon substrate which has been doped with a p-type impurity to possess sufficient conductivity to provide part of the current path through the LED. The p-type silicon substrate has epitaxially grown thereon a buffer region of n-type AlInGaN. Further grown epitaxially on the buffer region is the main semiconductor region of the LED which comprises a lower confining layer of n-type GaN, an active layer for generating light, and an upper confining layer of p-type GaN. In the course of the growth of the buffer region and main semiconductor region there occurs a thermal diffusion of gallium and other Group III elements from the buffer region into the p-type silicon substrate, with the consequent creation of a p-type low-resistance region in the substrate. Interface levels are created across the heterojunction between p-type silicon substrate and n-type buffer region. The interface levels expedite carrier transport from substrate to buffer region, contributing to reduction of the drive voltage requirement of the LED.

16 Claims, 5 Drawing Sheets

U.S. PATENT DOCUMENTS

| | | | |
|---|---|---|---|
| 5,858,826 A * | 1/1999 | Lee et al. | 438/228 |
| 6,573,558 B2 * | 6/2003 | Disney | 257/328 |
| 6,586,774 B2 * | 7/2003 | Ishibashi et al. | 257/94 |
| 6,586,781 B2 * | 7/2003 | Wu et al. | 257/194 |
| 6,617,060 B2 * | 9/2003 | Weeks et al. | 428/698 |
| 6,759,689 B2 * | 7/2004 | Adomi et al. | 257/98 |
| 2001/0052601 A1 * | 12/2001 | Onishi et al. | 257/138 |
| 2002/0045286 A1 * | 4/2002 | Koide et al. | 438/46 |
| 2002/0093030 A1 * | 7/2002 | Hsu et al. | 257/162 |
| 2003/0020061 A1 * | 1/2003 | Emerson et al. | 257/14 |
| 2003/0160264 A1 | 8/2003 | Yagi et al. | 257/183 |
| 2006/0118824 A1 * | 6/2006 | Otsuka et al. | 257/194 |
| 2006/0145177 A1 * | 7/2006 | Hagimoto et al. | 257/99 |

FOREIGN PATENT DOCUMENTS

| | | |
|---|---|---|
| JP | 2002-208729 A | 7/2002 |
| JP | 2003-59948 A | 2/2003 |
| JP | 2003-249642 A | 9/2003 |

OTHER PUBLICATIONS

Zhi Zhen Ye et al., "An Ultraviolet Photodetector Based on GaN /Si", *International Journal of Modern Physics B*, vol. 16, Nos. 28 & 29, 2002, pp. 4310-4313.

H. Marchand et al., "Metalorganic Chemical Vapor Deposition of GaN on Si (111): Stress Control and Application to Field-Effect Transistors", *Journal of Applied Physics*, vol. 89, No. 12, Jun. 15, 2001, pp. 7846-7851.

Ching-Wu Wang et al., "Effect of Rapid Thermal Annealing on Radio-Frequency Magnetron-Sputtered GaN Thin Films and Au/GaN Schottky Diodes", *Journal of the Vacuum Science & Technology B*, vol. 17, No. 4, Jul./Aug. 1999, p. 1545-1548.

* cited by examiner

NITRIDE-BASED SEMICONDUCTOR DEVICE OF REDUCED VOLTAGE DROP, AND METHOD OF FABRICATION

CROSS REFERENCE TO RELATED APPLICATIONS

This is a continuation of Application PCT/JP2004/013820 filed Sep. 22, 2004, which claims priority to Japanese Patent Application No. 2003-331882 filed Sep. 24, 2003, and Japanese Patent Application No. 2004-092211 filed Mar. 26, 2004.

BACKGROUND OF THE INVENTION

This invention relates to semiconductor devices such as light-emitting diodes (LEDs) and transistors, particularly to those employing nitrides or nitride-based compounds as semiconductors, and to a method of making such semiconductor devices.

Nitride-based semiconductor devices are usually built upon substrates of either sapphire, silicon carbide, or silicon. Silicon in particular offers the advantages of being less expensive and easier of dicing than sapphire or silicon carbide. Unlike sapphire, moreover, silicon can provide an electroconductive substrate that serves as part of the main current path through the device. Offsetting these advantages of the silicon substrate is a relatively great voltage drop caused by the potential barrier between the silicon substrate and the nitride semiconductor layers grown thereon. The nitride semiconductor LEDs with the silicon substrate have therefore required a drive voltage that is high enough to overcome the voltage drop.

Japanese Unexamined Patent Publication No. 2002-208729 teaches an LED configuration designed to preclude the noted shortcoming of the silicon substrate. It employs an n-type silicon substrate on which there is grown by epitaxy the main semiconductor region (i.e., region where light is generated) of the LED via a buffer region. The buffer region comprises an aluminum nitride (AlN) layer directly overlying the n-type silicon substrate, and an indium gallium nitride (InGaN) layer of the same conductivity type as that of the silicon substrate on the AlN layer. The main semiconductor region of the LED typically has an active layer of InGaN sandwiched between a lower cladding or confining layer of n-type gallium nitride (GaN) and an upper cladding or confining layer of p-type GaN.

In the course of the epitaxial growth of the successive layers of the buffer region and main semiconductor region of the above prior art LED on the n-type silicon substrate, there occur partial diffusions of aluminum from the lowermost AlN buffer layer, and of indium and gallium from the overlying InGaN buffer layer, into the silicon substrate. The result is the creation, at and adjacent the interface between silicon substrate and AlN layer, of a layer of the alloys or compounds of gallium, indium, aluminum and silicon. This alloy layer, as it might be so called, is in itself conducive to enhancement of LED efficiency as it reduces the potential barrier of the heterojunction between silicon substrate and AlN layer and so enables the LED to operate with a lower drive voltage than in the presence of the potential barrier discussed above. The LED is thus made less in power loss and higher in efficiency.

The trouble, however, is that aluminum, indium and gallium diffuse deeper down into the silicon substrate from the alloy layer. These Group III elements represent p-type impurities in the n-type silicon substrate, so that a pn junction was conventionally created in the substrate under the alloy layer.

This applicant has ascertained that the pn junction caused a forward voltage drop of 0.6 volt or so. The residual potential barrier between the silicon substrate and the nitride semiconductor layers thereon was still so high that the voltage drop across this prior art LED (in other words, its drive voltage) was approximately 1.2 times as great as that across the sapphire-substrate LED.

This shortcoming of the n-type silicon substrate in conjunction with the nitride semiconductor layers grown thereon has manifested itself with LEDs of different make having no alloy layer between substrate and buffer region. The same problem has been encountered not only with LEDs but additionally with other types of semiconductor device such as transistors in which the current flows through the silicon substrate in its thickness direction.

Another problem with LEDs has been how to create an electrode on the light-emitting surface of the LED so as to fulfill the dual, or even self-contradictory, requirement of enabling the emission of light therethrough and providing electric connections with external circuitry. A typical conventional solution was to overlay the light-emitting surface with a transparent sheet or film of a material such as a mixture of indium oxide and tin oxide and to place an opaque, metal-made wire-bonding pad centrally on the transparent overlay. The metal of the bonding pad is easy to diffuse into the transparent overlay and even into the underlying main semiconductor region, the transparent overlay being as thin as, say, ten nanometers. A Schottky barrier was therefore created between the bonding pad and the main semiconductor region. Capable of blocking the forward current of the LED, the Schottky barrier reduced the amount of current flowing right under the bonding pad and added to the amount of current flowing through the outer part of the semiconductor region which is out of register with the bonding pad.

Thus the Schottky barrier functions just like the current-blocking layer which has been conventionally formed under the bonding pad for preventing current flow there. The current flowing right under the bonding pad is a waste of energy because the light generated there is blocked by the opaque bonding pad. Only the light produced at the outer part of the main semiconductor region issues from the LED through the transparent overlay. The greater the proportion of the current flowing through the outer part of the main semiconductor region, the higher will be the efficiency of the LED.

The n-type silicon substrate necessitates as aforesaid the application of a high drive voltage forwardly of the LED, which is tantamount to more power losses and more heat production at both silicon substrate and main semiconductor region. The noted Schottkey barrier deteriorates as a result of the heating, permitting greater current flow therethrough and, in turn, causing less current flow through the outer part of the main semiconductor region. With the reduction of current flow through the outer part of the semiconductor region, a correspondingly less amount of light is generated and emitted through the transparent part of the electrode. The prior art LEDs having nitride semiconductors on n-type silicon substrates were therefore mostly unsatisfactory in the efficiency of light emission.

It has been known and practiced to create a dedicated current blocking layer of electrically insulating material between the bonding pad and the main semiconductor region. This solution is objectionable on account of the additional manufacturing steps, and the consequent higher manufacturing costs, needed for fabrication of the current blocking layer.

SUMMARY OF THE INVENTION

The present invention seeks, in a semiconductor device of the kind having nitride-based semiconductor regions grown on a silicon substrate, to minimize the voltage drop and to make the device operable with a lower drive voltage than heretofore.

Briefly stated in one aspect thereof, the invention concerns a nitride-based semiconductor device such as an LED or transistor capable of operation at a lower drive voltage than heretofore. Included is a substrate of p-type silicon having sufficient conductivity to provide part of a current path through the device. An n-type nitride semiconductor region, which contains one or more Group III elements, is formed on one of the opposite major surfaces of the substrate. A main semiconductor region is formed on the n-type nitride semiconductor region to provide a primary working part of the desired semiconductor device. A first electrode is formed on the main semiconductor region, and a second electrode on the other major surface of the substrate. The substrate includes a region where the Group III element or elements are thermally diffused from the n-type nitride semiconductor region without creation of a pn junction therein.

The term "main semiconductor region" as used above and in the claims appended hereto should be understood to comprehend various constructions depending upon the semiconductor devices to be made. For example, the main semiconductor region may comprise an active layer and a p-type nitride cladding for providing an LED, a p-type base region and n-type emitter region for providing a transistor, and a p-type body region and n-type source region for providing an insulated-gate field-effect transistor.

The noted n-type nitride semiconductor region is shown as a mono- and/or multilayered buffer region in the preferred embodiments disclosed herein. The buffer region is designed to cause the overlying main semiconductor region to faithfully succeed the crystal orientation of the underlying substrate. Further, in some such embodiments, an additional layer or intervention layer of an aluminum-containing nitride semiconductor is interposed between the substrate and the n-type nitride region.

Another aspect of the invention concerns a method of fabricating the semiconductor device of the foregoing construction. The method dictates, first of all, the provision of a substrate of p-type silicon having sufficient conductivity to provide part of a current path through the semiconductor device. There are epitaxially growing on this substrate an n-type nitride semiconductor region containing at least one Group III element, and then, on this n-type nitride semiconductor region, a nitride-based main semiconductor region constituting the primary working part of the semiconductor device. Thus, during the epitaxial growth of at least either of the n-type nitride semiconductor region and the nitride-based main semiconductor region, the Group III element is diffused from the n-type nitride semiconductor region into the substrate without creation of a pn junction.

The above summarized method is modifiable to include a step of epitaxially growing directly on the substrate the additional layer of a nitride semiconductor containing aluminum. Then the n-type nitride semiconductor region and then the nitride-based main semiconductor region are epitaxially grown on the additional layer. In this case both aluminum from the additional layer and Group III element from the n-type nitride semiconductor region are thermally diffused into the substrate without creation of a pn junction during the epitaxial growth of at least either of the additional layer, the n-type nitride semiconductor region, and the nitride-based main semiconductor region, aluminum.

The most pronounced feature of the invention resides in the fact that, despite the overlying n-type nitride semiconductor region, the silicon substrate is doped p type instead of the conventional n. Thermally diffused into the substrate from the n-type nitride semiconductor region during the epitaxial growth of this region and or the overlying main semiconductor region thereon, the Group III element or elements creates a low-resistance p-type region in the p-type substrate. No pn junction appears in the substrate, so that the drive voltage requirement of the device is materially reduced.

As an additional advantage, electric conductivity between the n-type nitride semiconductor region and the p-type silicon substrate is enhanced by virtue of interface levels at the heterojunction therebetween. Even in cases where the additional layer having a quantum-mechanical tunnel effect is interposed between the n-type nitride semiconductor region and the p-type silicon substrate, the interface levels exist across the additional layer. The interface levels accelerate the transport of carriers from the substrate into the n-type nitride semiconductor region, lessening the potential barrier of the heterojunction therebetween regardless of the presence or absence of the additional layer. The diminution of the drive voltage requirement leads to that of the power loss incurred by the device. This goal is accomplished, moreover, merely by alteration of the conductivity type of the silicon substrate from n to p, a change that does not cause an increase in the manufacturing cost of the device.

In an LED built upon the concepts of this invention, the noted first electrode on the main semiconductor region can be of the known design comprising a transparent film covering the light-emitting surface of the main semiconductor region, and a bonding pad placed centrally on the transparent film. In this case, as has been stated with respect to the prior art, a Schottkey barrier will be created between the bonding pad and the semiconductor region, preventing an unnecessary flow of forward current under the opaque bonding pad. However, should the LED have great power loss and easily generate heat, the Schottkey barrier would not function properly to block the forward current. No such dysfunction of the Schottkey barrier will occur in the LED of this invention because it causes much less power loss and generates much less heat than the prior art.

The above and other objects, features and advantages of this invention will become more apparent, and the invention itself will best be understood, from a study of the following description and appended claims, with reference had to the attached drawings showing the preferred embodiments of the invention.

DESCRIPTION OF THE PREFERRED EMBODIMENTS

Figure 1:
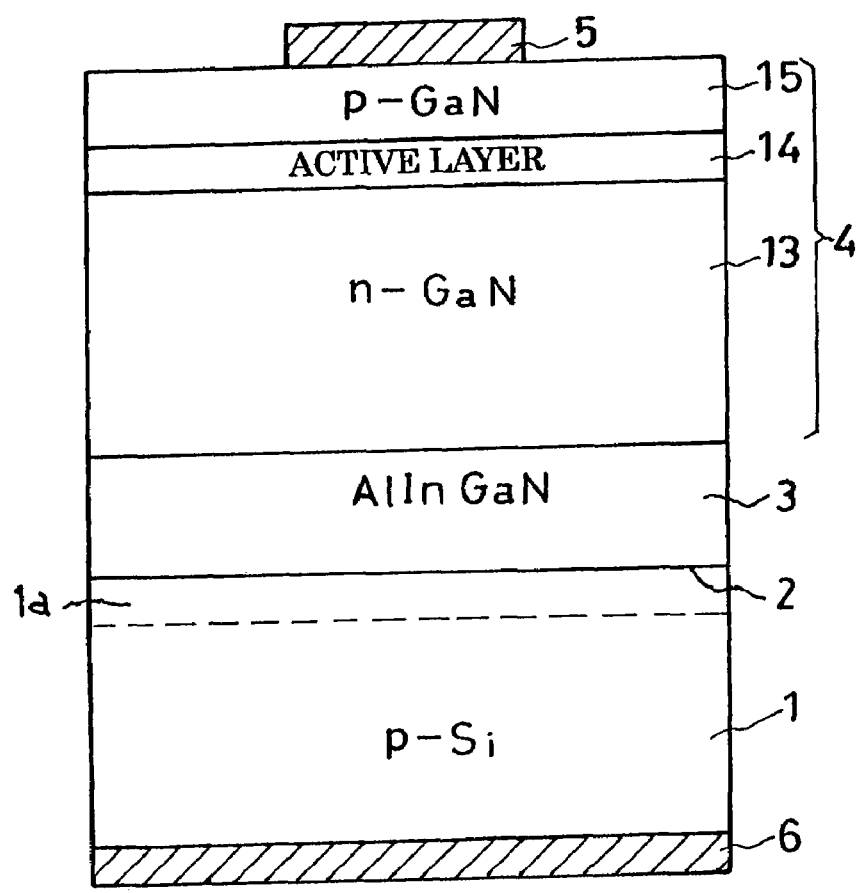
FIG. 1 is a schematic cross section through an LED embodying the principles of this invention.

The nitride-based semiconductor device according to the present invention will now be described more specifically in terms of the LED shown in FIG. 1 by way of a preferred embodiment of the invention. The exemplified LED broadly comprises:

1. A p-type silicon substrate 1.
2. A buffer region 3 of an n-type nitride semiconductor containing a Group III element or elements and grown epitaxially on the silicon substrate 1, with the consequent creation of a region $1_a$ in the substrate where the Group III element or elements of the nitride semiconductor are diffused from the buffer region.
3. A main semiconductor region 4 grown epitaxially on the buffer region 3, herein shown as having an active layer 14 confined between a pair of nitride semiconductor claddings 13 and 15 of opposite conductivity types for conventionally generating light.
4. A first electrode or anode 5 placed centrally on the exposed major surface of the main semiconductor region 4.
5. A second electrode or cathode 6 covering the complete underside of the silicon substrate 1.

Constituting a feature of this invention, the p-type silicon substrate 1 is made opposite in conductivity type to the overlying n-type buffer region 3. The substrate 1 gains the p-type conductivity by being doped with a p-type or acceptor impurity of boron or like Group III element to a concentration of from $5 \times 10^{18}$ cm$^{-3}$ to $5 \times 10^{19}$ cm$^{-3}$. This substrate 1 is therefore electrically conducting, being as low in resistivity as from 0.0001 to 0.0100 ohm-centimeter, thus providing part of the current path between the electrodes 5 and 6 in use of the LED. Additionally, being required to mechanically support the buffer region 3 and main semiconductor region 4, the substrate 1 must be sufficiently thick (e.g. 350 micrometers) for this function.

The buffer region 3 on the substrate 1 is made from a nitride semiconductor containing a Group III element or elements, plus an n-type or donor impurity. The nitride semiconductors adoptable for the buffer region 3 are generally defined as:

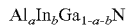

$$Al_a In_b Ga_{1-a-b} N$$

where the subscripts a and b are both numerals that are equal to or greater than zero and less than one, and the sum of a and b is less than one. Examples meeting this general definition include aluminum indium gallium nitride (AlInGaN), gallium nitride (GaN), aluminum indium nitride (AlInN), and aluminum gallium nitride (AlGaN). Of these, AlInGaN is currently believed to be most desirable. Preferably, the subscript a in the formula above is from 0.1 to 0.7, and the subscript b from 0.0001 to 0.5000. The composition of the buffer region 3 is $Al_{0.5}In_{0.01}Ga_{0.49}N$ in this particular embodiment of the invention.

The epitaxial growth of the n-type buffer region 3 of any of the above possible compositions on the p-type silicon substrate 1 results in the concurrent diffusion of the constituent Group III element or elements of the buffer region into the substrate to a certain limited depth from the interface 2 therebetween. At $1_a$ in FIG. 1 is shown the diffused Group III element region thus formed in the substrate 1. This diffused Group III element region $1_a$ is of p type and less in resistivity than the rest of the substrate 1.

The buffer region 3 functions primarily to cause the overlying main semiconductor region 4 to faithfully conform to the crystal orientation of the silicon substrate 1. The buffer region 3 should be not less than 10 nanometers thick in order to achieve this function and not more than 500 nanometers thick in order to prevent cracking. The buffer region 3 is 30 nanometers thick in this particular embodiment.

There is so little energy difference between the minimum level of the conduction band of a nitride semiconductor and the maximum level of the valence band of silicon, that a Type Two or Type Three heterojunction is created at the interface 2 between p-type silicon substrate 1 and n-type nitride semiconductor buffer region 3. The Type Two hetero-junction is such that, in the energy band diagram of two semiconductors forming a heterojunction, the maximum level of the valence band of one semiconductor lies intermediate the other semiconductor's maximum level of the valence band and minimum level of the conduction band. The Type Three heterojunction on the other hand is such that the maximum level of the valence band of one semiconductor is above the other semiconductor's minimum level of the conduction band.

Figure 3:
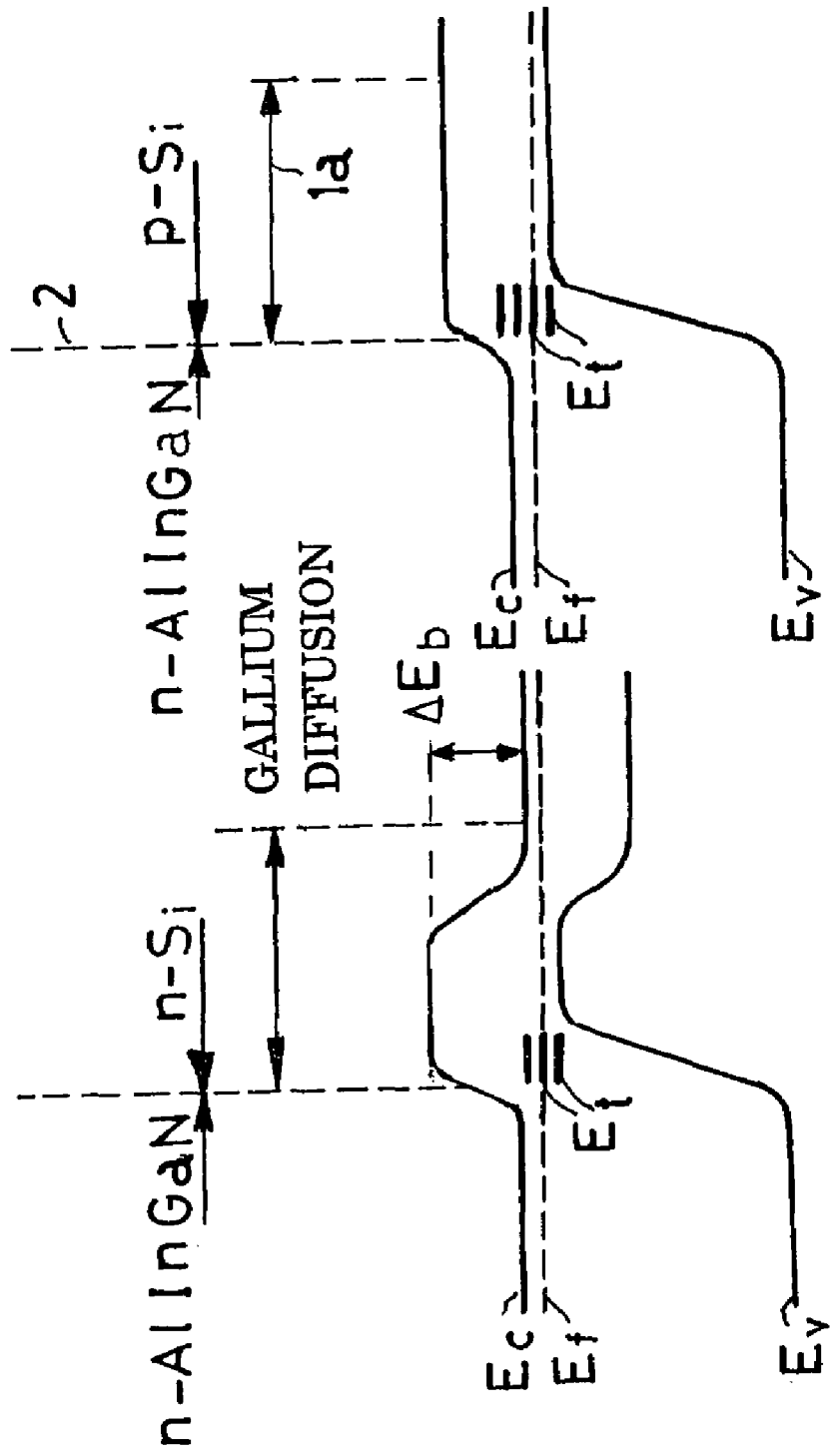
FIG. 3A is an energy band diagram of the prior art LED.
FIG. 3B is an energy band of the LED of FIG. 1 explanatory of how the drive voltage requirement is reduced.

Reference may be had briefly to FIG. 3B for a continued inspection of the Type Two heterojunction. FIG. 3B is the energy band diagram of the heterojunction between p-type silicon substrate 1 and n-type nitride-based semiconductor buffer region 2 in thermal equilibrium, plotted on the assumption that the heterojunction is of Type Two. FIG. 3A is a similar diagram for the prior art LED having the n-type silicon substrate. In both FIGS. 3A and 3B the indicia Ev represents the maximum level of the valence band, Ec the minimum level of the conduction band, and Ef the Fermi level.

As indicated at Et in the inhibition band of FIG. 3B, there exist many interface levels at the heterojunction interface 2 between p-type silicon substrate 1 and n-type buffer region 3. These interface levels Et facilitate the transfer of carriers (electrons) from the valence band of the p-type silicon substrate 1 to the conduction band of the n-type semiconductor buffer region 3. The result is a substantive reduction of the potential barrier at the heterojunction between substrate 1 and buffer region 3, making possible a corresponding curtailment of the drive voltage needed for an optical output of given intensity. FIGS. 3A and 3B will be later referred to in more detail If the heterojunction is of Type Three, on the other hand, carriers will travel directly from the valence band of the p-type silicon substrate 1 to the conduction band of the n-type semiconductor buffer region 3. The result is a less potential barrier at the heterojunction between substrate 1 and buffer region 3 and, therefore, a less drive voltage requirement of the LED for output light of given intensity.

The n-type nitride cladding 13, active layer 14, and p-type nitride cladding 15 of the main semiconductor region 4 are successively grown in that order on the buffer region 3 in order to provide an LED of the familiar double heterojunction design. The main semiconductor region 4 allows for a variety of departures from the illustrated configuration. For example, the n-type nitride semiconductor buffer region 3 may be made to additionally possess the same function as the lower cladding 13 of the active layer 14, the lower cladding 13 being then deletable. Even the active layer 14 may be omitted, and the two remaining nitride semiconductor layers 13 and 15 of opposite conductivity types held directly against each other.

In this embodiment the lower cladding 13 of the main semiconductor region 4 is made from, in addition to an n-type dopant, any of the nitride semiconductors that are generally defined as:

$$Al_xIn_yGa_{1-x-y}N$$

where the subscripts x and y are both numerals that are equal to or greater than zero and less than one. The lower cladding 13 of this particular embodiment is made from n-type GaN (both x and y are zero in the formula above) to a thickness of approximately two micrometers. The lower cladding 13 is greater in bandgap than the active layer 14.

The active layer 14 is fabricated from any of the nitride semiconductors that are generally expressed as:

$$Al_xIn_yGa_{1-x-y}N$$

where the subscripts x and y are both numerals that are equal to or greater than zero and less than one. The active layer 14 of this particular embodiment is made from InGaN (x=0). In practice the active layer 14 may preferentially take the form of the familiar multiple quantum well structure, although a single quantum well construction is adoptable as well. Optionally, the active layer 14 may be doped with a p- or n-type determinant.

The upper cladding 15 of the active layer 14 is made from, in addition to a p-type dopant, any of the nitride semiconductors that are generally defined by the formula:

$$Al_xIn_yGa_{1-x-y}N$$

where the subscripts x and y are both numerals that are equal to or greater than zero and less than one. The upper cladding 15 of this embodiment is made from p-type GaN (x=0, y=0) to a thickness of 500 nanometers. The bandgap of this upper cladding 15 is greater than that of the active layer 14.

All grown on the silicon substrate 1 via the buffer region 3, the n-type lower cladding 13, active layer 14 and p-type upper cladding 15 of the main semiconductor region 4 are favorable in crystallinity.

The anode 5 is positioned centrally on the surface of the p-type upper cladding 15 of the main semiconductor region 4 and electrically connected thereto. A contact layer of a p-type nitride semiconductor could be inserted between the anode 5 and the p-type upper cladding 15. The cathode 6 is bonded to the underside of the p-type silicon substrate 1.

Method of Fabrication

What follows is the method adopted by the present invention for method of making the LED of the FIG. 1 construction. The method started with the preparation of the p-type silicon substrate 1. The major surface of the silicon substrate 1, on which was to be formed the buffer region 3, was (111) in terms of Miller indices. This substrate was pretreated with an etchant containing hydrogen fluoride.

Introduced into the reactor of a commercially available organometallic vapor phase epitaxy (OMVPE) system, the silicon substrate 1 was first heated to 1170° C. and held at this temperature for 10 minutes by way of thermal cleaning for stripping the oxide film off its surfaces. Then, with the reactor allowed to cool to a temperature between 1000 and 1100° C., the gases of trimethylaluminum (TMAl), trimethylindium (TMIn), trimethylgallium (TMGa), ammonia ($NH_3$), and silane ($SiH_4$) were charged into the reactor in prescribed proportions, thereby growing by OMVPE the buffer region 3 of n-type AlInGaN on the substrate 1. The silicon contained in the $SiH_4$ gas was meant as the n-type dopant.

Next came the steps of successively growing the three constituent layers 13, 14 and 15 of the main semiconductor region 4 on the buffer region 3. The n-type GaN lower cladding 13 was first created by introducing TMGa, $SiH_4$ and $NH_3$ into the OMVPE reactor, with the substrate 1, complete with the buffer region 3 thereon, held at a temperature of 1000-1110° C. The lower cladding 13 of n-type GaN was thus grown to a thickness of two micrometers. The impurity concentration of this lower cladding 13 was approximately $3 \times 10^{18}$ cm$^{-3}$, less than that of the substrate 1. The crystallinity of the lower cladding 13 was good, obviously under the influence of the good crystallinity of the underlying buffer region 3.

The next step was the creation of the active layer 14 of multiple quantum well configuration which in this case was a lamination of alternating four barrier sublayers and four well sublayers. One barrier sublayer was first formed on the n-type nitride semiconductor layer 13. Toward this end the OMVPE reactor temperature was allowed to drop to 800° C., and the gases of TMGa, TMIn and $NH_3$ were charged into the reactor at prescribed rates. The barrier sublayer was grown to a thickness of 13 nanometers, and its composition was $In_{0.02}Ga_{0.98}N$.

Then one well sublayer was grown on the barrier sublayer by approximately the same method as that for fabrication of the barrier sublayer except for a change in the proportion of TMIn. The resulting well sublayer had the composition $In_{0.2}Ga_{0.8}N$ and was three nanometers thick.

The foregoing processes of fabricating one barrier sublayer and one well sublayer were cyclically repeated four times to complete the multiple quantum well active layer 14. Formed on the n-type nitride lower cladding 13 of good crystallinity, the active layer 14 was just as favorable in crystallinity. The active layer 14 could have been doped with a p-type impurity.

The next step was the fabrication of the upper cladding 15 of the active layer 14 which had been completed as above. The OMVPE reactor temperature was raised to 1000-1110° C., and there were introduced into this reactor the gases of TMGa, $NH_3$, and bis-cyclo pentadienylmagnesium ($Cp_2Mg$) in predetermined proportions. There was thus grown on the surface of the active layer 14 the upper cladding 15 of p-type GaN to a thickness of 500 nanometer. Magnesium was introduced to a density of $3 \times 10^{18}$ cm$^{-3}$ as a p-type dopant.

The production of the LED was completed as the electrodes 5 and 6 were conventionally formed by vacuum vapor deposition.

Figure 2:
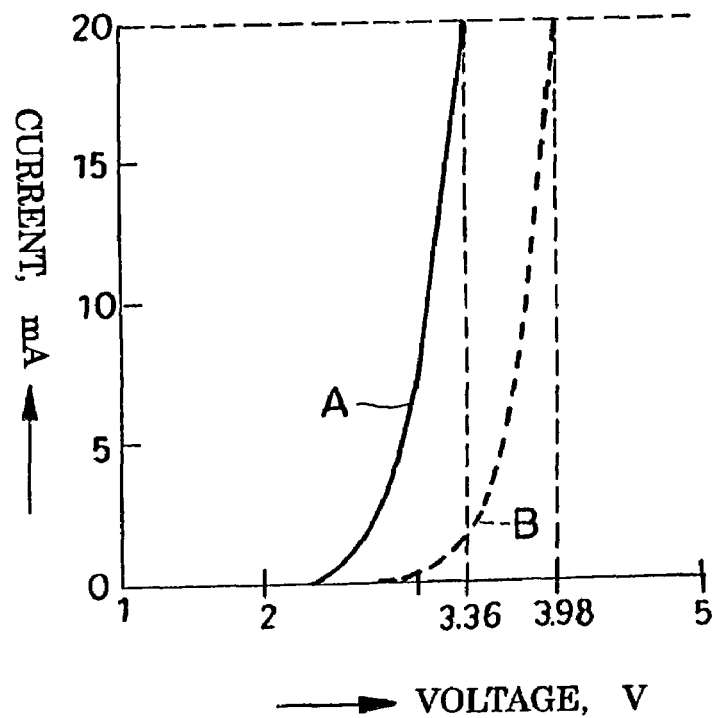
FIG. 2 is a graph plotting the curve of the magnitude of the current flowing through the LED of FIG. 1 against the forward drive voltage, together with a similar curve exhibited by the prior art LED of comparable make having an n-type silicon substrate.

The solid line curve A in the graph of FIG. 2 represents the magnitude, in milliamperes, of a current flowing through the LED of the FIG. 1 construction manufactured as above, against a forward voltage in volts applied thereto (top electrode 5 positive and bottom electrode 6 negative). The dashed line curve B in the same graph represents the magnitude of a current flowing through the LED of the noted prior art construction having the n-type silicon substrate, against a forward voltage. The graph indicates that for a current flow of 20 milliamperes, the inventive LED requires a drive voltage of 3.36 volts whereas the prior art LED demands that of as much as 3.98 volts. The 0.62 volt reduction in drive voltage is achieved for the current flow of 20 milliamperes by the simplest possible method of switching the conductivity type of the silicon substrate 1 from n to p.

Why the forward drive voltage is reducible with the p-type silicon substrate will become apparent from a comparative study of the energy band structures of the heterojunctions according to the invention and to the prior art. FIG. 3A is an energy band diagram of the heterojunction in the prior art LED, and FIG. 3B a similar diagram of the heterojunction in the LED constructed as in FIG. 1.

The prior art heterojunction in FIG. 3A is formed by the n-Si substrate and, grown directly thereon by epitaxy, n-AlInGaN region of the noted prior art LED. During the growth of the n-AlInGaN region a p-type semiconductor region appears in the n-Si substrate to a certain depth from its surface by thermal diffusion of gallium or other Group III element or elements from the n-AlInGaN region being formed. With the consequent creation of a pn junction within the substrate, a potential barrier is made which has a relatively great height $\Delta E_b$. This potential barrier is responsible for the high drive voltage requirement of the prior art device.

By contrast, in FIG. 3B, the heterojunction is constituted of the p-Si substrate 1, FIG. 1, and n-AlInGaN buffer region 3. No pn junction will be formed in the substrate 1 despite the diffusion of either one or more of gallium, aluminum and indium from the n-AlInGaN buffer region 3 into the substrate because these Group III elements represent p-type impurities in the p-type silicon substrate. Thus the heterojunction of the p-type substrate and n-type buffer region offers a far less potential barrier than does that of the prior art.

There is another reason why the LED of this invention requires a less drive voltage. There are many interface levels, indicated at $E_t$ in FIG. 3B, at the interface 2 of the heterojunction between p-type substrate 1 and n-type buffer region 3. Lying between the maximum level of the valence band of the p-type substrate 1 and the minimum level of the conduction band of the n-type buffer region 3 in the energy band diagram, the interface levels $E_t$ expedite the generation and recombination of the electrons and holes at and adjacent the heterojunction interface 2. The generation and recombination of electrons and holes are also accelerated at the region $1_a$ of the substrate 1 where the Group III element or elements are diffused from the overlying buffer region 3. Carrier injection takes place from substrate 1 to buffer region 3 via the interface levels $E_t$. With the efficacious carrier transportation the heterojunction between substrate 1 and buffer region 3 offers a less potential barrier to the electrons in the substrate, resulting in drastic curtailment of the forward drive voltage of the LED.

The foregoing will have made clear how the present invention succeeds in the substantive reduction of the drive voltage requirement of the LED without in any way adversely affecting the crystallinity of the main semiconductor region 4. A less drive voltage requirement is tantamount to less power loss. The invention accomplishes this advantageous effect, moreover, merely by switching the conductivity type of the silicon substrate from n to p. Thus the reduction of the drive voltage according to the invention does not necessitate any increase in the manufacturing cost of the device.

Figure 4:
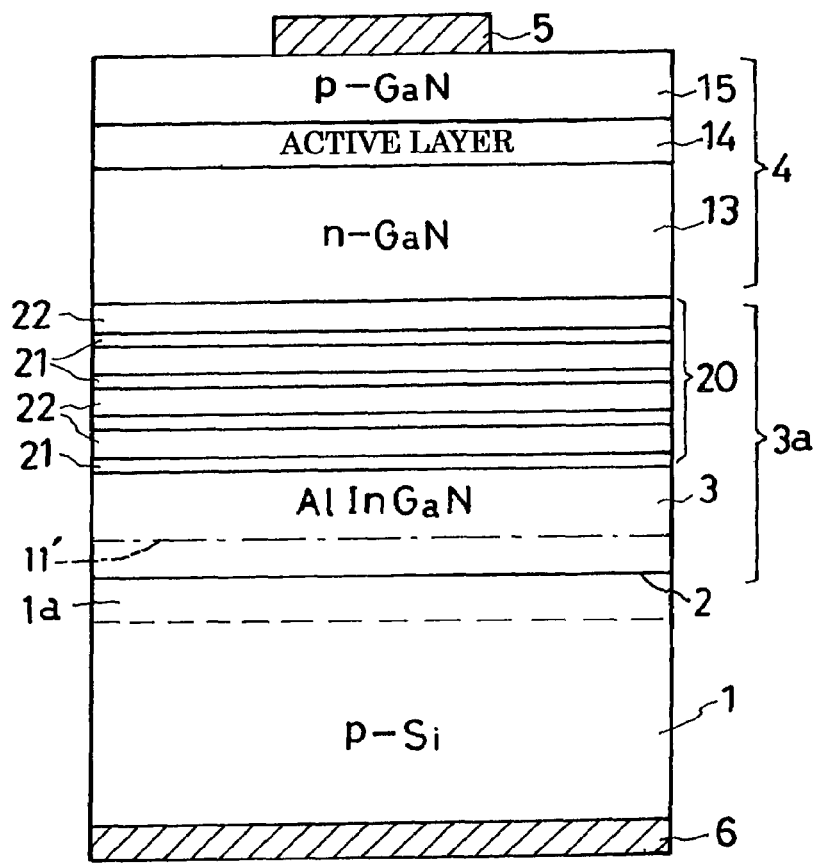
FIG. 4 is a schematic cross section through another preferred form of LED according to the invention.

Embodiment of FIG. 4

The LED shown in FIG. 4 by way of another preferred embodiment of the invention is akin to the FIG. 1 embodiment except for a modified buffer region $3_a$. The modified buffer region $3_a$ comprises a monolayered buffer subregion 3 of the same composition (n-AlInGaN) as its FIG. 1 counterpart designated by the same reference numeral, and a multilayered buffer subregion 20 interposed between the monolayered buffer subregion 3 and the n-type nitride semiconductor cladding 13 of the main semiconductor region 4.

The multilayered buffer subregion 20 is a required number of alternations of a first 21 and a second 22 buffer sublayer. The first buffer sublayers 21 are made from a nitride semiconductor containing at least aluminum, and the second buffer sublayers 22 from a nitride semiconductor that either does not contain aluminum or does contain aluminum in a less proportion than that of the aluminum content of the first buffer sublayers 21.

More specifically, the first buffer sublayers 21 are made from any of the aluminum-containing nitride semiconductor materials that are generally defined by the following formula, possibly plus an n-type dopant:

where M is at least either of indium and boron; the subscript x is a numeral that is greater than zero and equal to or less than one; the subscript y is a numeral that is equal to or greater than zero and less than one; and the sum of x and y is equal to or less than one. The first buffer sublayers 21 may be from one to 10 nanometers thick for providing the quantum-mechanical tunnel effect. In this particular embodiment the first buffer sublayers 21 are made from aluminum nitride plus silicon as an n-type dopant, although an undoped nitride semiconductor could be employed.

The second buffer layers 22 are made from any of the nitride semiconductor materials that are generally defined by the following formula, possibly plus an n-type dopant:

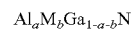

where M is at least either of indium and boron; the subscript a is a numeral that is equal to or greater than zero and less than one and, additionally, less than the subscript x in the formula above defining the materials for the first buffer sublayers 21; the subscript b is a numeral that is equal to or greater than zero and equal to or less than one; and the sum of a and b is equal to or less than one. Silicon may be added to any such materials as an n-type dopant. The second buffer sublayers 22 are made from n-type GaN in this embodiment but could be of the same material as the n-type buffer region 3. The second buffer sublayers 22 should be 10 nanometers or more thick for providing no quantum-mechanical tunnel effect. Speaking more broadly, however, the second buffer sublayers 22 may be of approximately the same thickness as the first buffer sublayers 21 and provide the quantum-mechanical tunnel effect.

All but the multilayered buffer subregion 20 of the FIG. 4 LED is manufacturable by the same method as that described above for that of FIG. 1. For fabrication of the multilayered buffer subregion 20 of the modified buffer region $3_a$, TMAl, SiH$_4$ and NH$_3$ were introduced into the reactor at the rates, respectively, of 50 micromoles per minute, 20 nanomoles per minute, and 0.14 moles per minute, until one first buffer sublayer 21 of AlN grew to a thickness of five nanometers on the n-type monolayered buffer subregion 3. Then, with the introduction of TMAl terminated, that of SiH$_4$ and NH$_3$ was continued, together with TMGa additionally supplied at a rate of 50 micromoles per minute, until one second buffer sublayer 22 of GaN grew to a thickness of 25 nanometers on the first buffer sublayer 21. The same process of growing one first buffer sublayer 21 and one second buffer sublayer 22 was repeated twenty times to complete the fabrication of the multilayered buffer subregion 20. Only four first buffer sublayers 21 and four buffer sublayers 22 are shown in FIG. 4 for simplicity.

The addition of the multilayered buffer subregion 20, as above, offers the advantage that the top surface of the buffer region $3_a$ is formed to a higher degree of flatness.

As a modification of the FIG. 4 embodiment the multilayered buffer subregion 20 could be formed directly on the p-type silicon substrate 1. In other words, the buffer region could be constituted solely of the alternating layers 21 and 22. The same holds true with the embodiments of FIGS. 1 and 6-9. Preferably, both layers 21 and 22 may be doped with an n-type impurity in cases where the multilayered buffer region is employed in substitution for the monolayered buffer region.

Figure 5:
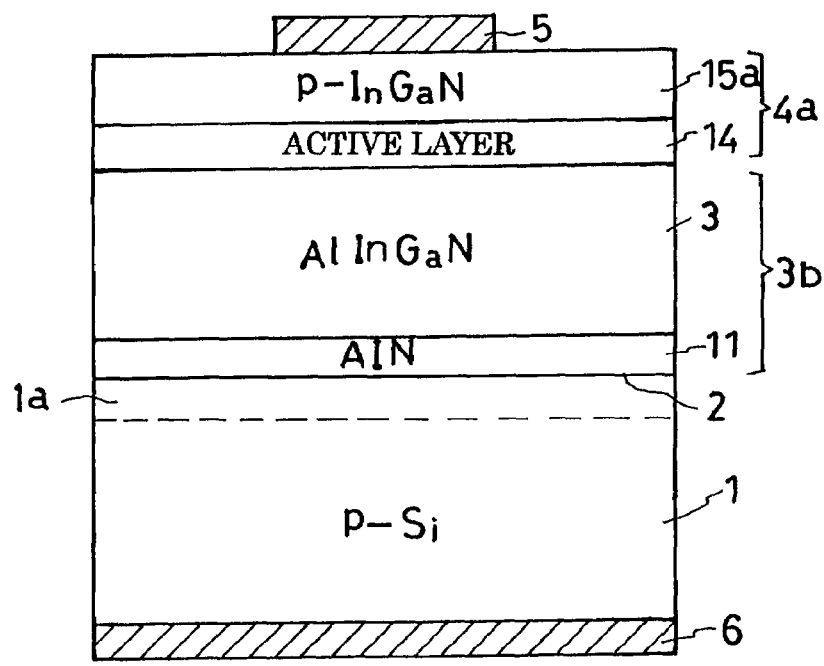
FIG. 5 is a schematic cross section through still another preferred form of LED according to the invention.

Embodiment of FIG. 5

FIG. 5 illustrates still another preferred form of LED according to the invention, which features an additional layer or intervention layer 11 of aluminum-containing nitride semiconductor interposed between p-type silicon substrate 1 and n-type buffer region 3. Another feature of this FIG. 5 embodiment is that the buffer region 3 doubles as the n-type cladding of the active layer 14, eliminating the dedicated lower cladding 13 of the FIGS. 1 and 4 embodiments. The buffer region 3 and additional layer 11 are shown as constituting in combination a modified buffer region $3_b$, and the active layer 14 and upper cladding $15_a$ of p-type InGaN as constituting in combination a modified main semiconductor region $4_a$. All the other details of construction are as previously set forth with reference to FIG. 1.

The additional layer 11 is fabricated from any of the nitride semiconductors that are generally expressed as:

$$Al_xIn_yGa_{1-x-y}N$$

where the subscript x is a numeral that is greater than zero and equal to or less than one; the subscript y is a numeral that is equal to or greater than zero and less than one; and the sum of x and y is greater than zero and equal to or less than one. The additional layer 11 does not, but may, contain an n-type dopant.

Although higher in resistivity than the buffer region 3, the additional layer 11 is from one to ten, preferably from two to three, nanometers thick to provide the quantum-mechanical tunnel effect. As a consequence, the additional layer 11 is practically negligible in terms of electric conductivity between p-type silicon substrate 1 and n-type buffer region 3, permitting good carrier injection from substrate to buffer region via the aforesaid interface levels $E_t$ at the heterojunction therebetween. Thus, as in the FIG. 1 embodiment, the heterojunction between substrate 1 and buffer region 3 offers a materially less potential barrier, with a corresponding curtailment of the drive voltage requirement of the LED.

For the best results, the additional layer 11 may be made from a material such that the difference in lattice constant between substrate 1 and additional layer 11 is less than the difference in that between substrate 1 and buffer region 3 or main semiconductor region 4. The difference in thermal expansion coefficient between substrate 1 and additional layer 11 should preferably be also less than the difference in that between substrate 1 and buffer region 3 or main semiconductor region 4.

Figure 6:
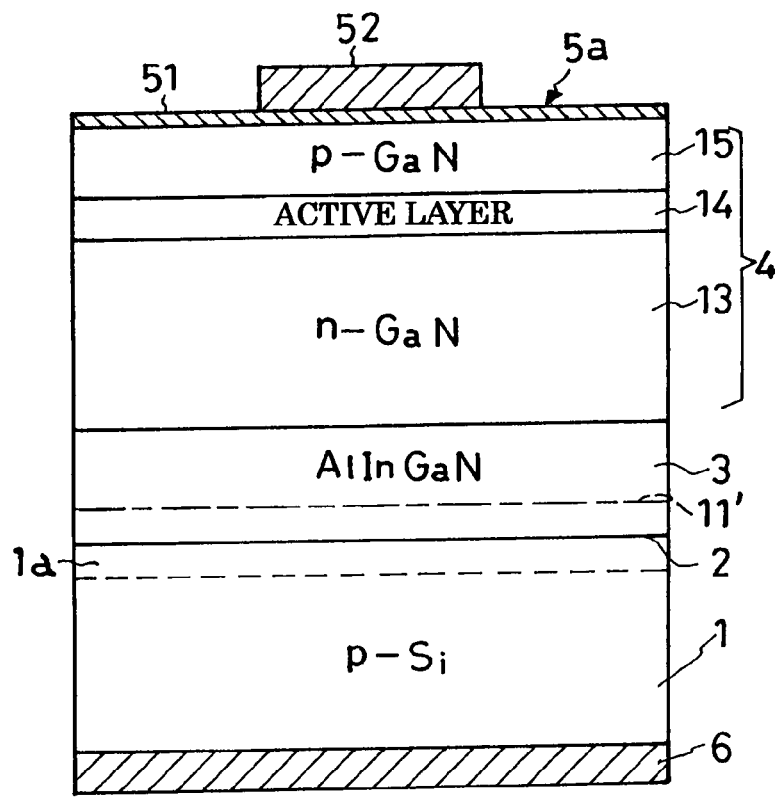
FIG. 6 is a schematic cross section through yet another preferred form of LED according to the invention.

Embodiment of FIG. 6

A modified top electrode $5_a$ is incorporated in the LED shown in FIG. 6 in substitution for the electrode 5 of the FIG. 1 embodiment. The FIG. 6 LED is identical with that of FIG. 1 in all the other details of construction. The modified top electrode $5_a$ is a combination of a transparent film 51 of electrically conducting material and a bonding pad 52 thereon. The transparent film 51 covers the entire exposed major surface of the main semiconductor region 4, or of its p-type nitride upper cladding 15. The bonding pad 52 is placed approximately centrally on the transparent film 51, leaving outer, marginal part of the transparent film 51 exposed for light emission therethrough.

Fabricated from a mixture of indium oxide ($In_2O_3$) and stannic oxide ($SnO_2$), the transparent film 51 is permeable to the light generated at the active layer 14. The transparent film 51 is approximately 10 nanometers thick and makes resistive contact with the p-type nitride upper cladding 15 of the main semiconductor region 4.

The bonding pad 52 on the other hand is made from metal such as nickel, gold, or aluminum, to a sufficient thickness to permit wire bonding. Made so thick, the bonding pad 52 is impermeable to the light from the active layer 14. It is understood that the metal from which is made the bonding pad 52 becomes diffused into the transparent film 52 or possibly further down into the main semiconductor region 4 either during the creation of the bonding pad or in the course of a subsequent manufacturing step. Such dispersed metal creates a Schottky barrier between bonding pad 52 and main semiconductor region 4.

Current will flow from the transparent film 51 to the main semiconductor region 4 upon application of a forward voltage between the electrodes $5_a$ and 6, by the "forward" voltage being meant that the top electrode $5_a$ is at a higher potential than the bottom electrode 6. Since the bonding pad 52 makes Schottky contact with the main semiconductor region 4, hardly any current will flow through the central part of the main semiconductor region which is in register with the bonding pad. As a result, current will flow mostly through the outer, peripheral part of the main semiconductor region 4 which is out of register with the bonding pad 52, from electrode $5_a$ to electrode 6. The light thus generated at the active layer 4 by the current flowing through the outer part of the main semiconductor region 4 can issue through the marginal part of the transparent film 51 without impediment by the opaque bonding pad 52.

As has been explained, the Schottky barrier would unavoidably deteriorate with a rise in the temperature of the LED in use, permitting progressively greater current leakage therethrough. The heating of the LED should therefore be avoided as far as possible. Fabricated on the p-type silicon substrate 1 as the FIG. 1 LED is, this FIG. 6 LED operates with a lower forward drive voltage, causing less power loss and generating less heat, than the prior art devices with the n-type silicon substrate. The Schottky barrier between the bonding pad 52 and the main semiconductor region 4 is thus saved from dysfunction due to the heating of the silicon substrate 1 and main semiconductor region 4.

Assuming that the same amount of current flows between the electrodes $5_a$ and 6 as in the prior art LED having the n-type silicon substrate, a greater proportion of this current will flow as aforesaid through the outer part of the main semiconductor region 4 in the LED of this invention than in that of the prior art, causing light to be generated and emitted with a higher efficiency than heretofore. Furthermore, if the main semiconductor region 4 and silicon substrate 1 are to be allowed to generate as much heat as in the prior art LED with the n-type silicon substrate, current of greater magnitude than heretofore may be made to flow through the outer part of the main semiconductor region for emission of light of greater intensity.

The top electrode configuration of FIG. 6, with the accompanying Schottky barrier, precludes the creation of an independent current-blocking layer. The manufacture of the LED is therefore simpler and more economical than in the case where the current-blocking layer is separately created. This same top electrode configuration is applicable to the LEDs of FIGS. 4 and 5.

Figure 7:
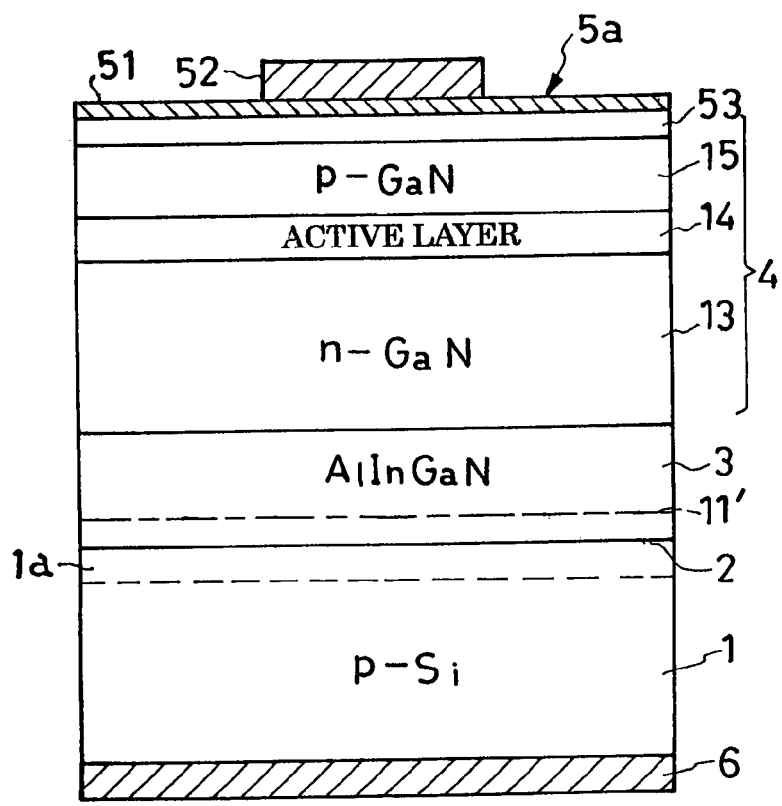
FIG. 7 is a schematic cross section through a further preferred form of LED according to the invention.

Embodiment of FIG. 7

This embodiment is identical in construction with that of FIG. 6 except for the interposition of an additional n-type nitride semiconductor layer 53 between the transparent film 51 of the top electrode $5_a$ and the p-type nitride cladding 15 of the main semiconductor region 4. The additional n-type nitride semiconductor layer 53 is made from, in addition to an n-type dopant, any of the nitride semiconductors that are generally expressed as:

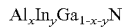

$$Al_xIn_yGa_{1-x-y}N$$

where the subscripts x and y are both numerals that are equal to or greater than zero and less than one. The additional n-type nitride semiconductor layer 53 of this embodiment of the invention is made from n-type GaN (both x and y are zero in the formula above).

In the case where the transparent film 51 of the top electrode $5_a$ is of a mixture of indium oxide and stannic oxide, which behaves like n-type semiconductors, this transparent film and the additional n-type nitride semiconductor layer 53 make ohmic contact of such low resistance that a further reduction of power loss is accomplished, permitting a further decrease in forward drive voltage and an increase in efficiency.

The pn junction between the p-type nitride semiconductor layer 15 and the additional n-type nitride semiconductor layer 53 should also offer minimal impediment to the flow of forward current therethrough. Toward this end, as well as for providing the quantum-mechanical tunnel effect, the additional n-type nitride semiconductor layer 52 may be from one to 30 nanometers, preferably from five to 10 nanometers, in thickness.

An application of a forward voltage between the electrodes $5_a$ and 6 of this LED will result in current flow from the transparent film 51 into the p-type nitride semiconductor cladding 15 via the additional n-type nitride semiconductor layer 53. The forward voltage drop across the junction between cladding 15 and transparent film 51, with the n-type nitride semiconductor layer 53 interposed therebetween, is less than that in the FIG. 6 embodiment which does not have the layer 53. The forward drive voltage of this LED is therefore reducible.

The teachings of FIG. 7, both top electrode configuration $5_a$ and additional n-type nitride semiconductor layer 53, are applicable to the LEDs of FIGS. 4 and 5 as well.

Figure 8:
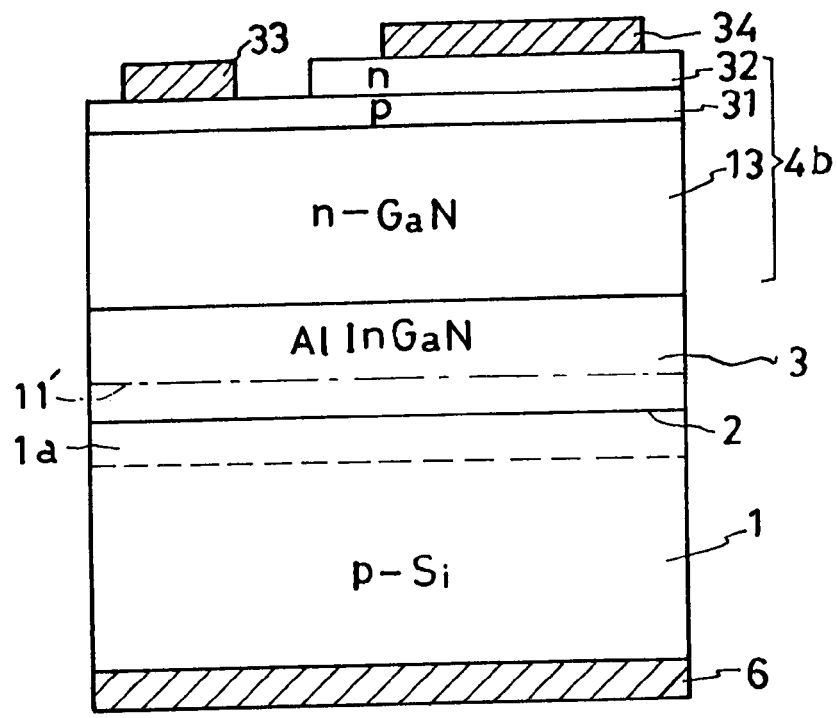
FIG. 8 is a schematic cross section through a transistor embodying the principles of the invention.

Embodiment of FIG. 8

The concepts of this invention are applicable not only to LEDs but to transistors too, as in FIG. 8, in which the main semiconductor region 4 of the FIG. 1 LED is reconfigured into that generally designated $4_b$ for providing a transistor. This transistor is similar to the FIG. 1 LED in all the details of construction other than the main semiconductor region $4_b$.

The main semiconductor region $4_b$ of the transistor comprises an n-type nitride semiconductor collector subregion 13 of the same composition (n-GaN) as the n-type nitride LED layer 13, FIG. 1, a p-type nitride semiconductor base subregion 31 grown epitaxially on the collector subregion 13, and an n-type nitride semiconductor emitter subregion 32 grown epitaxially on the base subregion 31. A base electrode 33 is formed on the base subregion 31, and an emitter electrode 34 on the emitter subregion 32. The electrode 6 underlying the p-type silicon substrate 1 serves as the collector.

Being of npn type, this transistor is driven with the collector electrode 6 at the highest potential to cause current flow toward the emitter electrode 34. It is clear that the voltage drop between the two main electrodes 6 and 34 of the transistor is reduced as with the FIG. 1 LED.

Figure 9:
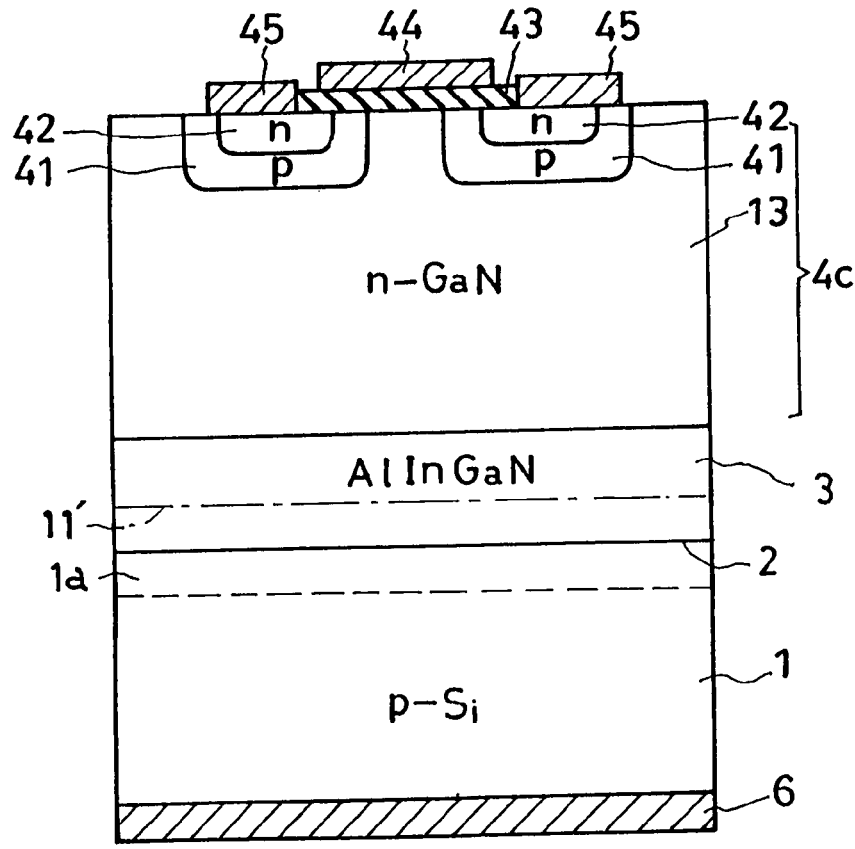
FIG. 9 is a schematic cross section through a field-effect transistor embodying the principles of the invention.

Embodiment of FIG. 9

FIG. 9 represents an application of the instant invention to an insulated-gate field-effect transistor (IGFET). The nitride semiconductor IGFET is analogous in construction with the FIG. 1 LED except that the main semiconductor region 4 of the latter is replaced by a main semiconductor region $4_c$ for an IGFET. The main semiconductor region $4_c$ includes a drain subregion 13 of the same n-GaN composition as the n-type nitride semiconductor layer, indicated by the same reference numeral, of the main semiconductor region 4 in FIG. 1. The drain subregion 13 has a p-type nitride semiconductor body subregion 41 formed therein by introduction of a p-type impurity, and this body subregion 41 has an n-type nitride semiconductor source subregion 42 formed therein by introduction of an n-type impurity. A gate electrode 44 is formed via an electrically insulating film 43 on the exposed surface of the body subregion 41. A source electrode 45 is joined directly to the source subregion 42. The electrode 6 under the p-type silicon substrate 1 serves as the drain electrode. It is apparent that a less voltage drop occurs between source 45 and drain 6 in this FET, too.

Possible Modifications

Notwithstanding the foregoing detailed disclosure it is not desired that the present invention be limited by the exact showings of the drawings or the description thereof. The following is a brief list of possible modifications, alterations or adaptations of the illustrated embodiments of the invention which are all believed to fall within the purview of the claims annexed hereto:

1. The buffer region 3 of the FIGS. 6 and 7 LEDs, of the FIG. 8 transistor, and of the FIG. 9 IGFET is replaceable by the buffer region $3_a$, FIG. 4, or by the buffer region $3_b$, FIG. 5.

2. The n-type nitride semiconductor layer 13 may be omitted from the embodiments of FIGS. 6-9, in which case the buffer region 3 will double as the lower cladding of the active layer in the LEDs of FIGS. 6 and 7, as the collector region in the transistor of FIG. 8, and as the drain region in the IGFET of FIG. 9.

3. The additional layer 11 of aluminum-containing nitride semiconductor with the quantum-mechanical tunnel effect could be employed not only in the FIG. 5 embodiment but in the embodiments of FIGS. 4 and 6-9 as well. Such an additional layer is indicated in phantom outline designated 11' in FIGS. 4 and 6-9.

4. An additional semiconductor layer or layers may be incorporated with the buffer regions 3, $3_a$ and $3_b$.

5. The buffer region 3, $3_a$ and $3_b$ may not necessarily contain indium.

6. The invention is adaptable for pn-junction rectifier diodes, Schottky barrier diodes, or indeed any semiconductor devices in which current flows through the substrate in its thickness direction.

What is claimed is:

1. A light-emitting diode comprising:
    (a) a substrate of p-type silicon having sufficient conductivity to provide part of a current path through the light-emitting diode, the substrate having a pair of opposite major surfaces;
    (b) an n-type nitride semiconductor region formed on one of the major surfaces of the substrate, the n-type nitride semiconductor region containing at least one Group III element;
    (c) a main semiconductor region formed on the n-type nitride semiconductor region, the main semiconductor region comprising an active layer and a p-type nitride semiconductor layer formed thereon;
    (d) an anode electrode electrically connected to the p-type nitride semiconductor layer of the main semiconductor region;
    (e) a cathode electrode formed on the other of the pair of opposite major surfaces of the substrate; and
    (f) there being a region in the substrate in which the Group III element is diffused from the n-type nitride semiconductor region, the diffused Group III element region being a p-type, wherein the diffused Group III element region is formed in the substrate so as to permit current flow from the n-type nitride semiconductor region to the p-type silicon substrate.

2. A light-emitting diode as defined in claim 1, wherein the n-type nitride semiconductor region is made from any of nitrides that are generally defined by the following formula, plus an n-type dopant:

$Al_aIn_bGa_{1-a-b}N$ where the subscripts a and b are both numerals that are equal to or greater than zero and less than one, and the sum of a and b is less than one.

3. A light-emitting diode as defined in claim 1, further comprising an additional layer interposed between the n-type nitride semiconductor region and the p-type silicon substrate, the additional layer having a thickness capable of providing a quantum-mechanical tunnel effect and a resistivity higher than that of the n-type nitride semiconductor region.

4. A light-emitting diode as defined in claim 3, wherein the additional layer is of an aluminum-containing nitride semiconductor.

5. A light-emitting diode as defined in claim 4, wherein the n-type nitride semiconductor region is made from any of nitrides that are generally defined by the following formula, plus an n-type dopant:

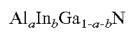

$Al_aIn_bGa_{1-a-b}N$ where the subscripts a and b are both numerals that are equal to or greater than zero and less than one, and the sum of a and b is less than one, and wherein the additional layer is made from any of nitrides that are generally defined by the formula:

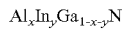

$Al_xIn_yGa_{1-x-y}N$ where the subscript x is a numeral that is greater than zero, greater than a in the formula above defining the nitrides for the n-type nitride semiconductor region, and equal to or less than one; the subscript y is a numeral that is equal to or greater than zero and less than one; and the sum of x and y is greater than zero and equal to or less than one.

6. A light-emitting diode as defined in claim 1, further comprising a multilayered buffer region between the n-type nitride semiconductor region and the main semiconductor region, the multilayered buffer region being a required number of alternations of a first layer of a nitride semiconductor containing aluminum in a first proportion and a second layer of another nitride semiconductor containing aluminum in a second proportion that is either zero or less than the first proportion.

7. A light-emitting diode as defined in claim 1, wherein the n-type nitride semiconductor region comprises a required number of alternations of a first layer of a nitride semiconductor containing aluminum in a first proportion and a second layer of another nitride semiconductor containing aluminum in a second proportion that is either zero or less than the first proportion.

8. A nitride-based semiconductor device comprising:
    (a) a substrate of p-type silicon having sufficient conductivity to provide part of a current path through the semiconductor device, the substrate having a pair of opposite major surfaces;
    (b) an n-type nitride semiconductor region formed on one of the major surfaces of the substrate, the n-type nitride semiconductor region containing at least one Group III element;
    (c) a multilayered buffer region formed on the n-type nitride semiconductor region, the multilayered buffer region being a required number of alternations of a first and second layer, wherein the first layers have each a thickness capable of providing a quantum-mechanical tunnel effect and are made from any of nitrides that are generally defined by the formula:

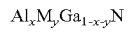

$Al_xM_yGa_{1-x-y}N$ where M is at least either of indium and boron; the subscript x is a numeral that is greater than zero and equal to or less than one; the subscript y is a numeral that is equal to or greater than zero and less than one; and the sum of x and y is equal to or less than one; and wherein the second layers are made from any of nitrides that are generally defined by the formula:

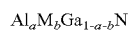

$Al_aM_bGa_{1-a-b}N$ where M is at least either of indium and boron; the subscript a is a numeral that is equal to or greater than zero, less than one, and less than x in the formula above defining the nitrides for the first layers; the subscript b is a numeral that is equal to or greater than zero and equal to or less than one; and the sum of a and b is equal to or less than one;
    (d) a main semiconductor region formed on the multilayered buffer region to provide a primary working part of the semiconductor device;
    (e) a first electrode formed on the main semiconductor region;
    (f) a second electrode formed on the other major surface of the substrate; and
    (g) there being a region in the substrate in which the Group III element is diffused from the n-type nitride semiconductor region, the Group III element being a p-type impurity in the p-type silicon substrate.

9. A nitride-based semiconductor device as defined in claim 8, wherein the main semiconductor region comprises an active layer formed on the multilayered buffer region for generating light, and a p-type nitride semiconductor layer formed on the active layer, wherein the first electrode is an anode electrically connected to the p-type nitride semiconductor layer of the main semiconductor region, and wherein the second electrode is a cathode.

10. A nitride-based semiconductor device as defined in claim 9, wherein the first electrode comprises:
    (a) a transparent film of electrically conducting material on the p-type nitride semiconductor layer of the main semiconductor region; and
    (b) a metal-made bonding pad on the transparent film.

11. A nitride-based semiconductor device as defined in claim 10, further comprising an additional n-type nitride semiconductor layer interposed between the p-type nitride semiconductor layer of the main semiconductor region and the transparent film of the first electrode.

12. A nitride-based semiconductor device as defined in claim 8, wherein the main semiconductor region comprises a p-type base subregion and an n-type emitter subregion, wherein the first electrode is an emitter electrically connected to the emitter subregion, wherein the second electrode is a collector, and wherein the semiconductor device further comprises a base electrode electrically connected to the base subregion.

13. A nitride-based semiconductor device as defined in claim 8, wherein the main semiconductor region comprises a p-type body subregion and an n-type source subregion which are contiguous to each other, wherein the first electrode is a source electrically connected to the source subregion, wherein the second electrode is a drain, and wherein the semiconductor device further comprises a gate.

14. A method of making a light-emitting diode, which comprises:
(a) providing a substrate of p-type silicon having sufficient conductivity to provide part of a current path through the semiconductor device;
(b) epitaxially growing on the substrate an n-type nitride semiconductor region containing at least one Group III element; and
(c) epitaxially growing a nitride-based main semiconductor region of the light-emitting diode on the n-type nitride semiconductor region, the nitride-based main semiconductor region comprising an active layer and a p-type nitride semiconductor layer formed thereon;
(d) forming an anode electrode on the n-type nitride semiconductor layer of the main semiconductor region; and
(e) forming a cathode electrode on the other of the pair of opposite major surfaces of the substrate,
(f) whereby the substrate has created therein a region in which, during the epitaxial growth of at least either of the n-type nitride semiconductor region and the nitride-based main semiconductor region, the Group III element is diffused from the n-type nitride semiconductor region without creation of a pn junction in the substrate, the diffused Group III element region being a p-type,
wherein the diffused group III element region is formed in the substrate so as to permit current flow from the n-type nitride semiconductor region to the p-type silicon substrate.

15. A method of making a light-emitting diode, which comprises:

(a) providing a substrate of p-type silicon having sufficient conductivity to provide part of a current path through the light-emitting diode;
(b) epitaxially growing on the substrate an additional layer of a nitride semiconductor containing aluminum;
(c) epitaxially growing on the additional layer an n-type nitride semiconductor region containing at least one Group III element; and
(d) epitaxially growing a nitride-based main semiconductor region of the light-emitting diode on the n-type nitride semiconductor region, the nitride-based main semiconductor region comprising an active layer and a p-type nitride semiconductor layer formed thereon;
(e) forming an anode electrode on the n-type nitride semiconductor layer of the main semiconductor region; and
(f) forming a cathode electrode on the other of the pair of opposite major surfaces of the substrate,
(g) whereby the substrate has created therein a region in which, during the epitaxial growth of at least either of the additional layer and the n-type nitride semiconductor region and the nitride-based main semiconductor region, aluminum from the additional layer and the Group III element from the n-type nitride semiconductor region are diffused without creation of a pn junction in the substrate, the diffused Group III element region being a p-type, wherein the diffused Group III element region is formed in the substrate so as to permit current flow from the n-type nitride semiconductor region to the p-type silicon substrate.

16. A light-emitting diode as defined in claim 7, wherein the first layers have each a thickness capable of providing a quantum-mechanical tunnel effect and are made from any of nitrides that are generally defined by the formula:

$$Al_xM_yGa_{1-x-y}N$$

where M is at least either of indium and boron; the subscript x is a numeral that is greater than zero and equal to or less than one; the subscript y is a numeral that is equal to or greater than zero and less than one; and the sum of x and y is equal to or less than one; and wherein the second layers are made from any of nitrides that are generally defined by the formula:

$$Al_aM_bGa_{1-a-b}N$$

where M is at least either of indium and boron; the subscript a is a numeral that is equal to or greater than zero, less than one, and less than x in the formula above defining the nitrides for the first layers; the subscript b is a numeral that is equal to or greater than zero and equal to or less than one; and the sum of a and b is equal to or less than one.

* * * * *